US012777642B2

(12) United States Patent
Kim

(10) Patent No.: US 12,777,642 B2
(45) Date of Patent: Oct. 27, 2026

(54) SEMICONDUCTOR MEMORY DEVICE WITH IMPROVED WORD LINE FAILURE

(71) Applicant: SK hynix Inc., Icheon-si (KR)

(72) Inventor: Hyun Sub Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 619 days.

(21) Appl. No.: 18/112,367

(22) Filed: Feb. 21, 2023

(65) Prior Publication Data

US 2024/0074189 A1 Feb. 29, 2024

(30) Foreign Application Priority Data

Aug. 31, 2022 (KR) ........................ 10-2022-0110077

(51) Int. Cl.
*H10B 43/27* (2023.01)
*H10B 43/35* (2023.01)

(52) U.S. Cl.
CPC ............. *H10B 43/27* (2023.02); *H10B 43/35* (2023.02)

(58) Field of Classification Search
CPC ........ H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50
See application file for complete search history.

(56) References Cited

U.S. PATENT DOCUMENTS

| | | | | |
|---|---|---|---|---|
| 2018/0247953 A1* | 8/2018 | Lee | ........................ | H10B 43/40 |
| 2020/0273881 A1* | 8/2020 | Kim | ........................ | H10B 41/10 |

FOREIGN PATENT DOCUMENTS

| | | | |
|---|---|---|---|
| KR | 1020180106303 | A | 10/2018 |
| KR | 1020200103484 | A | 9/2020 |
| KR | 1020200127650 | A | 11/2020 |
| KR | 1020220019896 | A | 2/2022 |

* cited by examiner

*Primary Examiner* — William B Partridge
*Assistant Examiner* — Gustavo G Ramallo
(74) *Attorney, Agent, or Firm* — WILLIAM PARK AND ASSOCIATES LTD.

(57) ABSTRACT

Provided herein is a semiconductor memory device and a method of manufacturing the same. The semiconductor memory device includes a first dummy stacked body and a second dummy stacked body formed in a connection area of a substrate including a cell array area and the connection area, a cell stacked body disposed in the cell array area and the connection area and configured to enclose the first dummy stacked body and the second dummy stacked body, and a first vertical barrier disposed at a boundary between the cell stacked body and the first dummy stacked body and a second vertical barrier disposed at a boundary between the cell stacked body and the second dummy stacked body. The cell stacked body includes first and second extensions disposed to extend in substantially a linear shape in the connection area and a connector configured to connect the first and second extensions.

16 Claims, 16 Drawing Sheets

SEMICONDUCTOR MEMORY DEVICE WITH IMPROVED WORD LINE FAILURE

CROSS-REFERENCE TO RELATED APPLICATION

The present application claims priority under 35 U.S.C. § 119(a) to Korean patent application number 10-2022-0110077, filed on Aug. 31, 2022, in the Korean Intellectual Property Office, the entire disclosure of which is incorporated herein by reference.

BACKGROUND

1. Technical Field

Various embodiments of the present disclosure relate to an electronic device, and more particularly to a semiconductor memory device having a vertical channel structure and a method of manufacturing the semiconductor memory device.

2. Related Art

A data storage device using a semiconductor memory device is advantageous in that, since there is no mechanical driving part, stability and durability are excellent, an information access speed is high, and power consumption is low. The data storage device, as examples of the memory system having such advantages, includes a universal serial bus (USB) memory device, memory cards having various interfaces, a solid state drive (SSD), etc.

A semiconductor memory device includes memory cells capable of storing data. In order to improve the degree of integration of memory cells, a three-dimensional (3D) semiconductor memory device has been proposed.

The 3D semiconductor memory device may include memory cells arranged in three dimensions. The degree of integration of the 3D semiconductor memory device may be improved as the number of stacks of memory cells increases. As the number of stacks of memory cells increases, technology capable of improving the structural stability of the 3D semiconductor memory device is required.

SUMMARY

An embodiment of the present disclosure may provide for a semiconductor memory device. The semiconductor memory device may include a first dummy stacked body and a second dummy stacked body formed in a connection area of a substrate including a cell array area and the connection area, a cell stacked body disposed in the cell array area and the connection area and configured to enclose the first dummy stacked body and the second dummy stacked body, and a first vertical barrier disposed at a boundary between the cell stacked body and the first dummy stacked body and a second vertical barrier disposed at a boundary between the cell stacked body and the second dummy stacked body, wherein the cell stacked body comprises first and second extensions disposed to extend in substantially a linear shape in the connection area and a connector configured to connect the first and second extensions to each other.

An embodiment of the present disclosure may provide for a semiconductor memory device. The semiconductor memory device may include a cell stacked body including a first extension and a second extension that extend substantially in parallel in substantially a linear shape in a connection area of a substrate, a first vertical barrier and a second vertical barrier disposed adjacent to each other between the first extension and the second extension, and configured to have a shape of substantially a rectangular frame, a first dummy stacked body disposed to contact an inner wall of the first vertical barrier and a second dummy stacked body disposed to contact an inner wall of the second vertical barrier, and a connector disposed in a space between the first vertical barrier and the second vertical barrier and configured to connect the first extension and the second extension to each other.

An embodiment of the present disclosure may provide for a method of manufacturing a semiconductor memory device. The method may include forming a stacked body by stacking a plurality of interlayer insulating layers and a plurality of sacrificial layers on a substrate on which a source layer is formed, forming first and second trenches configured to pass through the stacked body and have a shape of substantially a rectangular frame, forming a first vertical barrier and a second vertical barrier by filling the first and second trenches with a filling material, allowing sidewalls of the plurality of sacrificial layers to be exposed by forming a slit passing through the stacked body, and forming gate regions by removing the plurality of exposed sacrificial layers, and forming conductive patterns for word lines by filling the gate regions with a conductive material.

DETAILED DESCRIPTION

Specific structural or functional descriptions in the embodiments of the present disclosure introduced in this specification or application are provided as examples to describe embodiments according to the concept of the present disclosure. The embodiments according to the concept of the present disclosure may be practiced in various forms, and should not be construed as being limited to the embodiments described in the specification or application.

Various embodiments of the present disclosure are directed to a semiconductor memory device that is capable of improving structural stability and a method of manufacturing the semiconductor memory device.

Figure 1:
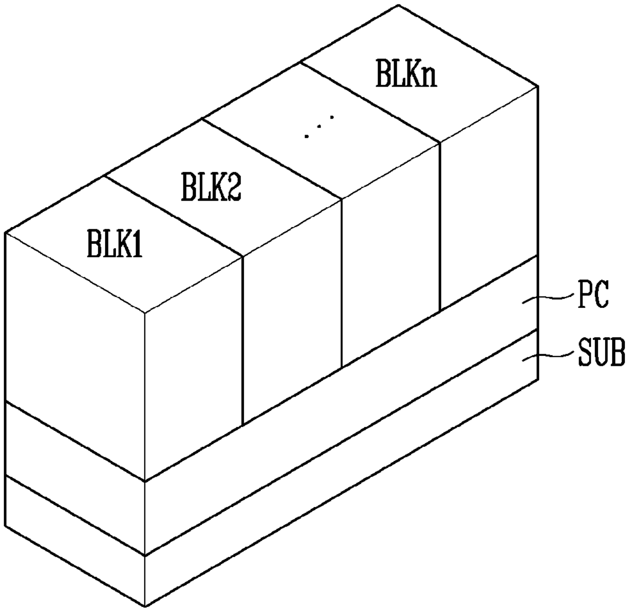
FIG. 1 is a view schematically illustrating a semiconductor memory device according to an embodiment of the present disclosure.

FIG. 1 is a view schematically illustrating a semiconductor memory device according to an embodiment of the present disclosure.

Referring to FIG. 1, the semiconductor memory device may include a peripheral circuit structure PC and memory blocks BLK1 to BLKn that are disposed on a substrate SUB. The memory blocks BLK1 to BLKn may overlap the peripheral circuit structure PC.

The substrate SUB may be a single-crystal semiconductor layer. For example, the substrate SUB may be a bulk silicon substrate, a silicon-on-insulator substrate, a germanium substrate, a germanium-on-insulator substrate, a silicon-germanium substrate, or an epitaxial thin film substrate formed using a selective epitaxial growth method.

The peripheral circuit structure PC may include a row decoder, a column decoder, a page buffer, a control circuit, etc., which constitute a circuit for controlling the operations of the memory blocks BLK1 to BLKn. For example, the peripheral circuit structure PC may include an NMOS transistor, a PMOS transistor, a resistor, a capacitor, etc., which are electrically connected to the memory blocks BLK1 to BLKn. The peripheral circuit structure PC may be disposed between the substrate SUB and the memory blocks BLK1 to BLKn.

Each of the memory blocks BLK1 to BLKn may include impurity-doped regions, bit lines, cell strings electrically connected to the impurity-doped regions and the bit lines, word lines electrically connected to the cell strings, and select lines electrically connected to the cell strings. Each of the cell strings may include memory cells and select transistors which are connected in series to each other through a channel structure. Each of the select lines may be used as a gate electrode of a select transistor corresponding thereto, and each of the word lines may be used as a gate electrode of a memory cell corresponding thereto.

In an embodiment, the substrate SUB, the peripheral circuit structure PC, and the memory blocks BLK1 to BLKn may be stacked in a reverse order to that shown in FIG. 1. In this case, the peripheral circuit structure PC may be disposed on the memory blocks BLK1 to BLKn.

Figure 2:
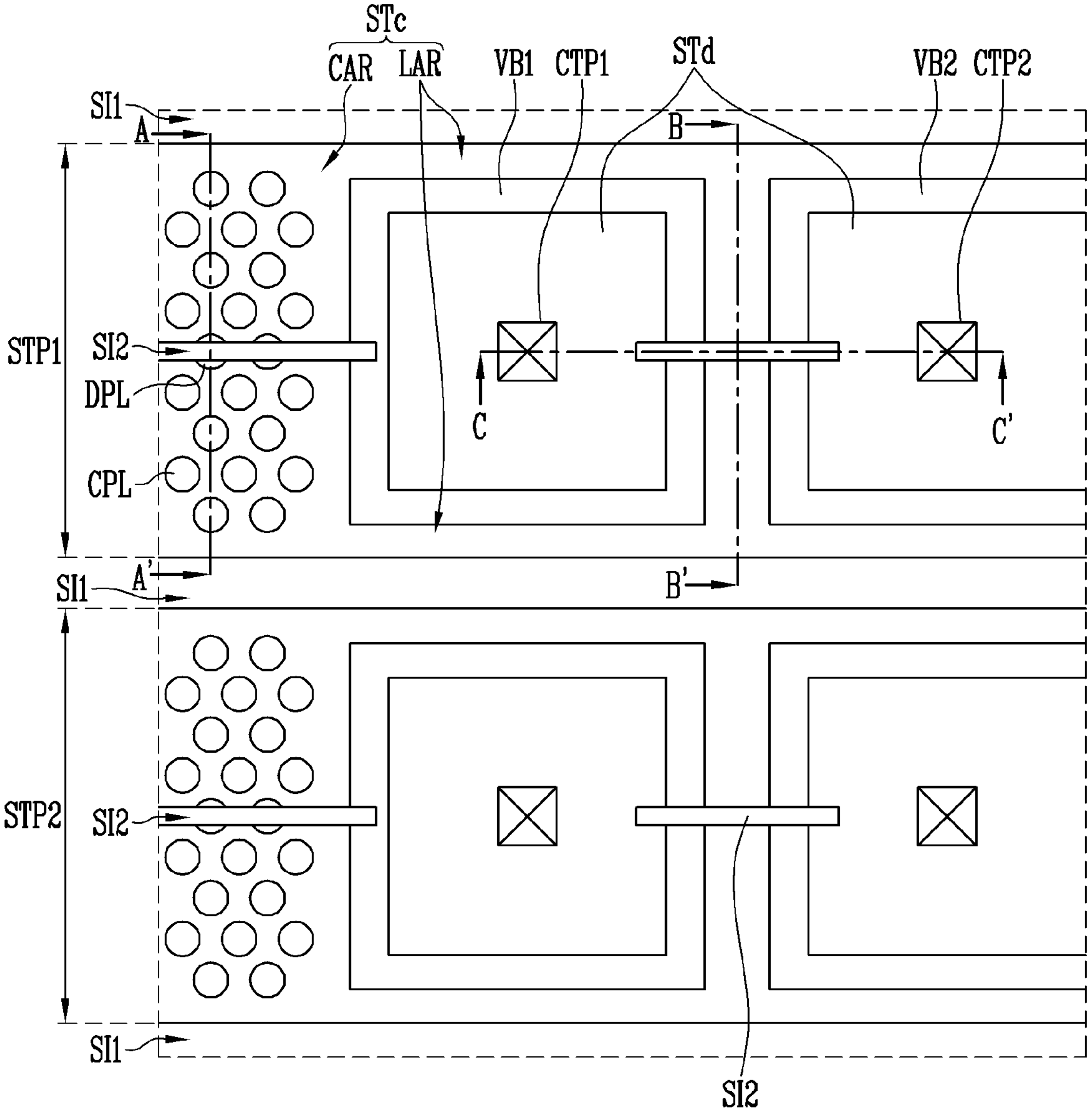
FIG. 2 is a plan view illustrating a memory block according to an embodiment of the present disclosure.

FIG. 2 is a plan view illustrating a memory block according to an embodiment of the present disclosure.

Referring to FIG. 2, at least one of first and second stacked patterns STP1 and STP2 separated from each other by first slits SI1 may form a memory block. In an embodiment, the first and second stacked patterns STP1 and STP2 may form the first and second memory blocks BLK1 and BLK2, respectively, illustrated in FIG. 1. In an embodiment, the first and second stacked patterns STP1 and STP2 may form one memory block. Embodiments of the present disclosure are not limited thereto. For example, three or more stacked patterns may form one memory block.

Each of the first and second stacked patterns STP1 and STP2 may include a dummy stacked body STd, a cell stacked body STc, a first vertical barrier VB1, and a second vertical barrier VB2. Each of the first and second stacked patterns STP1 and STP2 may include two or more vertical barriers VB1 and VB2. The cell stacked body STc may enclose the dummy stacked body STd, and the first vertical barrier VB1 and the second vertical barrier VB2 may extend along a boundary between the cell stacked body STc and the dummy stacked body STd. The first vertical barrier VB1 and the second vertical barrier VB2 may be disposed adjacent to each other, and the cell stacked body STc may be disposed in a space between the first vertical barrier VB1 and the second vertical barrier VB2.

The cell stacked body STc may be disposed in a cell array area CAR and a connection area LAR. The cell array area CAR may be an area in which cell strings are disposed. The cell array area CAR may extend parallel to the first slits SI1. The connection area LAR may extend from the cell array area CAR. The dummy stacked body STd may be disposed in the connection area LAR.

The cell stacked body STc disposed in the cell array area CAR may be penetrated by cell plugs CPL. Each of the cell plugs CPL may form a cell string corresponding thereto. The cell plugs CPL may be arranged in a matrix structure or in a zigzag shape between neighboring first slits SI1. The cell plugs CPL may form rows along the extension direction of the first slits SI1. The cell plugs CPL penetrating the cell stacked body STc in the cell array area CAR may be divided into a plurality of rows. The plurality of rows may be divided into different groups by second slits SI2 passing through a portion of the cell stacked body STc in the cell array area CAR. The cell stacked body STc disposed in the connection area LAR may have an H-shape or a ladder shape. That is, the cell stacked body STc disposed in the connection area LAR may extend in the shape of a plurality of lines along the first slits SI1, and may have the H shape or the ladder shape by filling the space between the first vertical barrier VB1 and the second vertical barrier VB2.

Each second slit SI2 may extend towards the dummy stacked body STd to be coupled to the first vertical barrier VB1. The second slit SI2 may overlap dummy plugs DPL arranged along the second slit SI2. The dummy plugs DPL may be formed simultaneously with the cell plugs CPL. The second slit SI2 may pass through a portion of the cell stacked body STc disposed between the first vertical barrier VB1 and the second vertical barrier VB2. The words "simultaneous" and "simultaneously" as used herein with respect to processes mean that the processes take place on overlapping intervals of time. For example, if a first process takes place over a first interval of time and a second process takes place simultaneously over a second interval of time, then the first and second intervals of time at least partially overlap each other such that there exists a time at which the first and second processes are both taking place.

The dummy stacked body STd may be penetrated by first and second contact plugs CTP1 and CTP2. The first and second contact plugs CTP1 and CTP2 may be coupled to the peripheral circuit structure PC illustrated in FIG. 1.

In an embodiment of the present disclosure, although one contact plug (e.g., CTP1) is illustrated as penetrating the dummy stacked body STd enclosed by one vertical barrier (e.g., VB1), a plurality of contact plugs may penetrate the dummy stacked body STd enclosed by one vertical barrier (e.g., VB1).

A process of forming the cell stacked body STc may include a process of injecting a conductive material through the first slits SI1. The first and second vertical barriers VB1 and VB2 may prevent or mitigate the conductive material injected through the first slits SI1 from flowing into the dummy stacked body STd. The first and second vertical barriers VB1 and VB2 may be formed simultaneously with the cell plugs CPL. Accordingly, an embodiment of the present disclosure may simplify the manufacturing process.

Figure 3A:
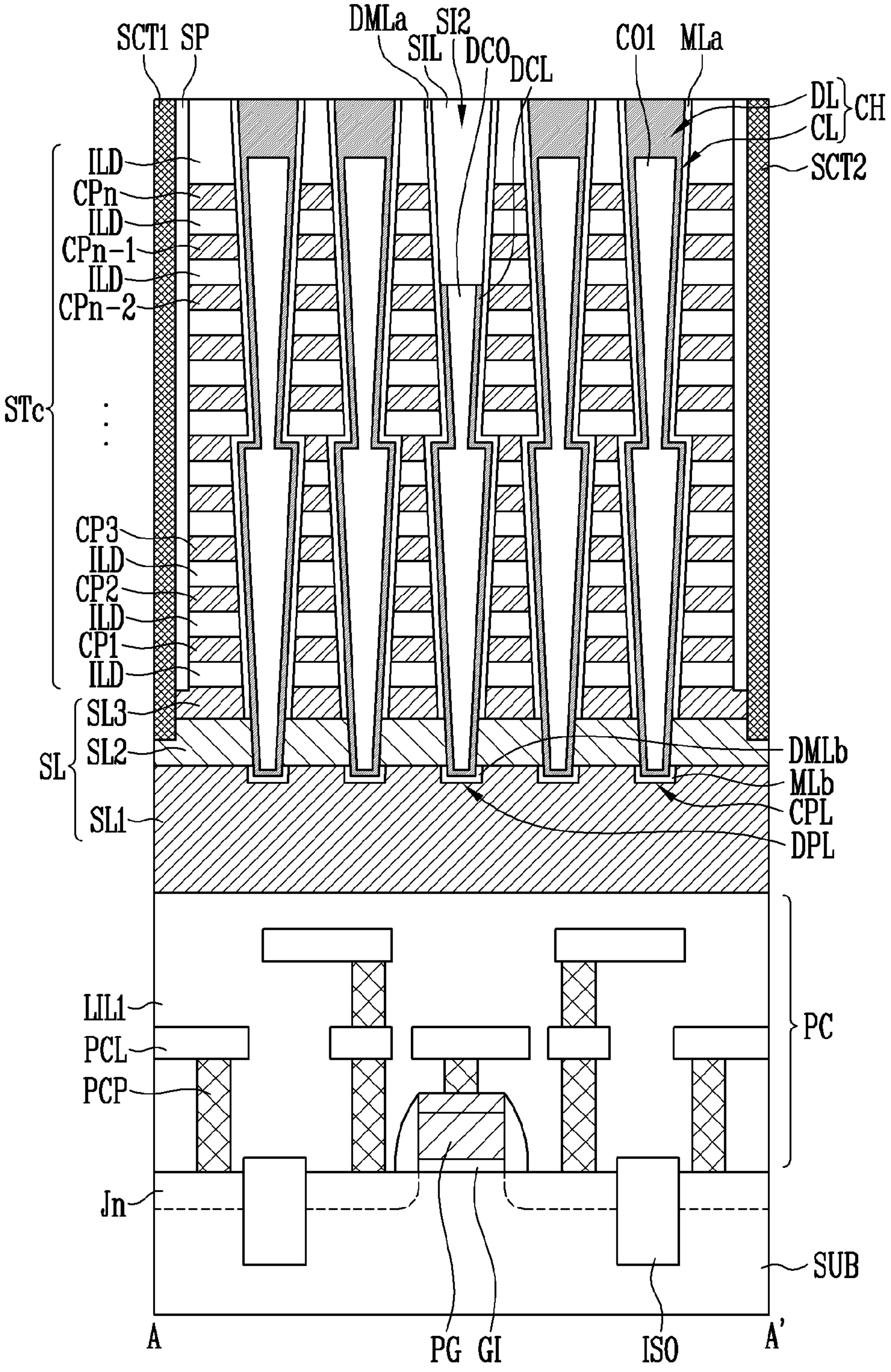
FIGS. 3A, 3B, and 3C are sectional views of the semiconductor memory device taken along lines A-A', B-B', and C-C' of FIG. 2, respectively.
Figure 3B:
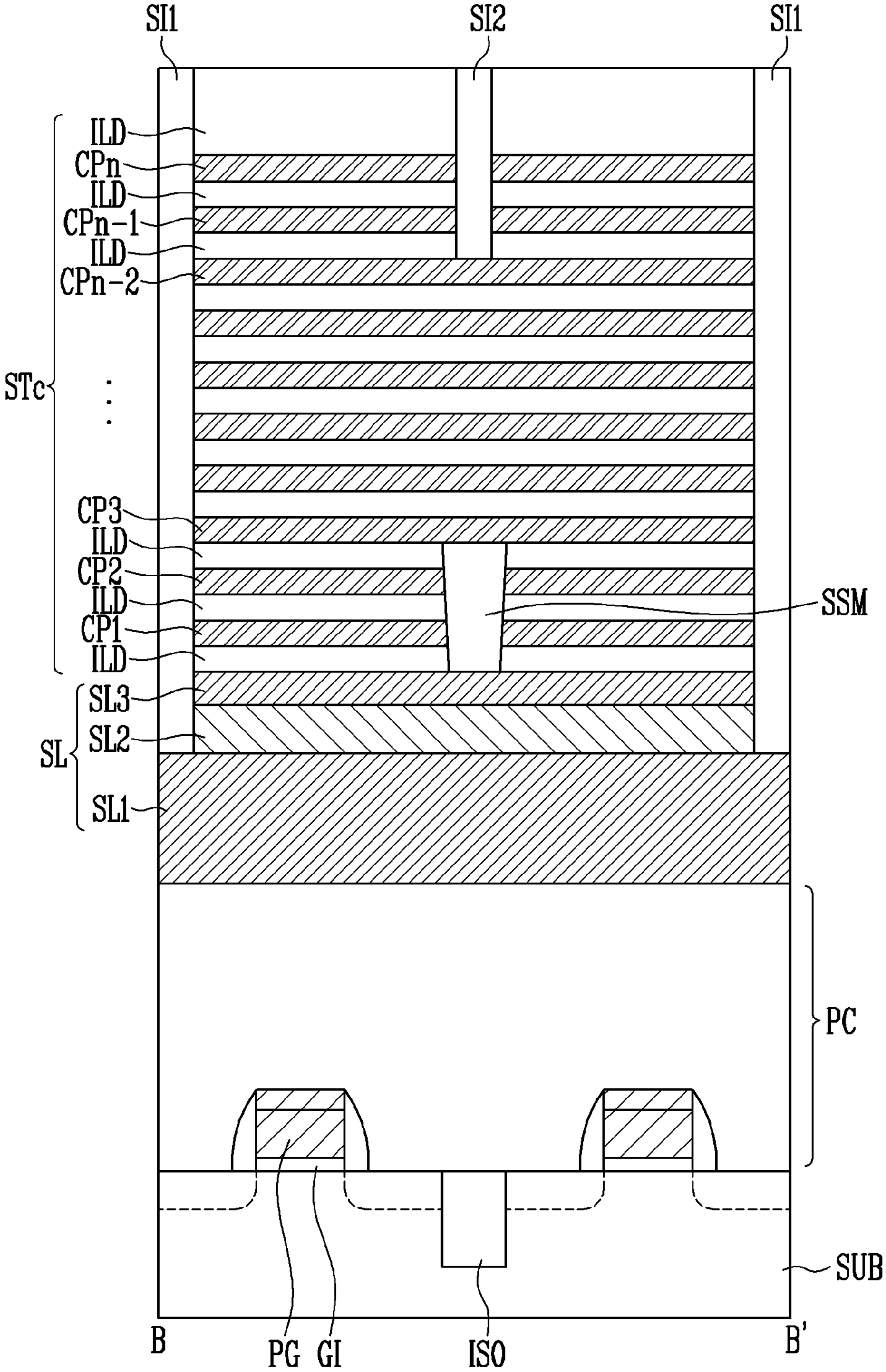
Figure 3C:
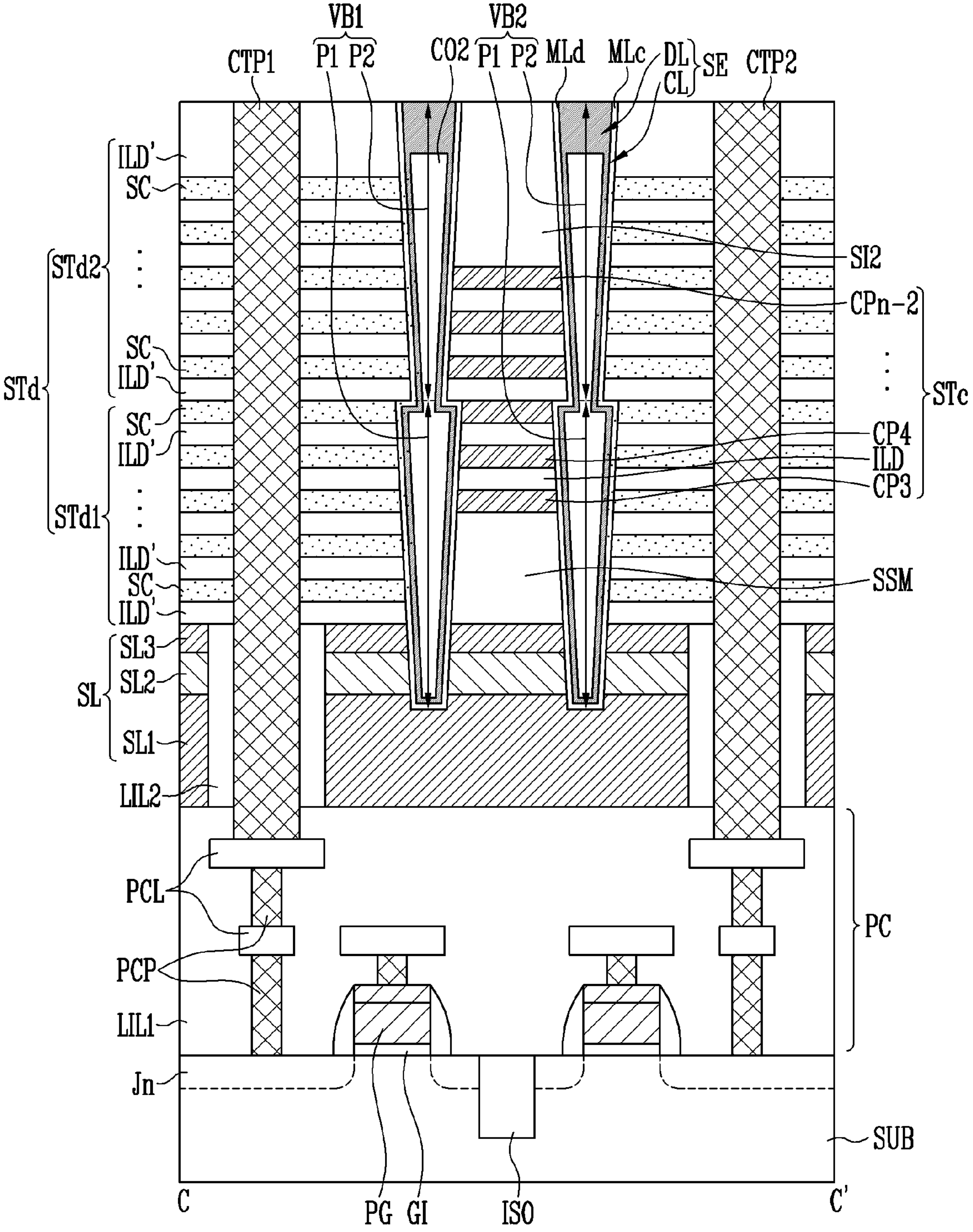

FIGS. 3A, 3B, and 3C are sectional views of the semiconductor memory device taken along lines A-A', B-B', and C-C' of FIG. 2, respectively.

Referring to FIGS. 3A to 3C, the cell stacked body STc and the dummy stacked body STd may overlap a source structure SL and a peripheral circuit structure PC. The source structure SL may be disposed between a stacked structure, including the cell stacked body STc and the dummy stacked body STd, and the peripheral circuit structure PC.

Each of the first vertical barrier VB1, the second vertical barrier VB2, the cell plugs CPL, and the dummy plugs DPL may protrude longer than the cell stacked body STc and the dummy stacked body STd, and may extend into the source structure SL.

The peripheral circuit structure PC may be disposed on the substrate SUB, as described above with reference to FIG. 1. The substrate SUB may include well regions doped with n-type or p-type impurities, and each of the well regions of the substrate SUB may include active regions partitioned by an isolation layer ISO. The isolation layer ISO is formed of an insulating material.

The peripheral circuit structure PC may include peripheral gate electrodes PG, a gate insulating layer GI, junctions Jn, peripheral circuit lines PCL, and lower contact plugs PCP. The peripheral circuit structure PC may be covered with a first lower insulating layer LIL1.

The peripheral gate electrodes PG may be used as respective gate electrodes of an NMOS transistor and a PMOS transistor. The gate insulating layer GI may be disposed between each peripheral gate electrode PG and the substrate SUB. The junctions Jn may be regions defined by implanting n-type or p-type impurities into active regions overlapping the peripheral gate electrodes PG, and may be disposed on both sides of each of the peripheral gate electrodes PG. One of the junctions Jn disposed on both sides of each peripheral gate electrode PG may be used as a source junction, and the other thereof may be used as a drain junction. The peripheral circuit lines PCL may be electrically connected to a circuit for controlling a memory block through the lower contact plugs PCP. The circuit for controlling the memory block may include an NMOS transistor, a PMOS transistor, a resistor, a capacitor, etc., as described above. For example, the NMOS transistor may be coupled to the peripheral circuit lines PCL through the lower contact plugs PCP.

The first lower insulating layer LIL1 may cover the peripheral circuit lines PCL and the lower contact plugs PCP. The first lower insulating layer LIL1 may include insulating layers stacked in a multi-layer structure.

The source structure SL may enclose respective ends of the first and second vertical barriers VB1 and VB2, the cell plugs CPL, and the dummy plugs DPL, and may extend to overlap the cell stacked body STc and the dummy stacked body STd. The source structure SL may be coupled to source contact structures SCT1 and SCT2. The source contact structures SCT1 and SCT2 may be conductive materials disposed in the first silts SI1 illustrated in FIG. 2. Each of the source contact structures SCT1 and SCT2 may include various conductive materials, such as a doped silicon layer, a metal layer, a metal silicide layer, and a barrier layer, and may include two or more kinds of conductive materials. For example, each of the source contact structures SCT1 and SCT2 may be formed of a stacked structure of a doped silicon layer, which contacts the source structure SL, and a metal layer formed on the doped silicon layer. The doped silicon layer may include an n-type dopant, and the metal layer may include low-resistance metal such as tungsten so as to decrease resistance. FIG. 3A illustrates the first and second source contact structures SCT1 and SCT2 neighboring each other.

Each of the first source contact structure SCT1 and the second source contact structure SCT2 may be isolated from the cell stacked body STc by a spacer insulating layer SP. The source structure SL may be penetrated by a second lower insulating layer LIL2 disposed on the first lower insulating layer LIL1. The second lower insulating layer LIL2 may overlap the dummy stacked body STd.

The first and second contact plugs CTP1 and CTP2 penetrating the dummy stacked body STd may extend to penetrate the second lower insulating layer LIL2 and the first lower insulating layer LIL1, and may be coupled to any one of the peripheral circuit lines PCL. For example, the first and second contact plugs CTP1 and CTP2 may be connected to the peripheral circuit lines PCL electrically connected to an NMOS transistor forming a block select transistor. Embodiments of the present disclosure are not limited thereto. For example, the first and second contact plugs CTP1 and CTP2 may contact a peripheral circuit line connected to a resister, a peripheral circuit line coupled to a PMOS transistor, or a peripheral circuit line coupled to a capacitor.

The source structure SL may include first to third source layers SL1 to SL3. Each of the first and third source layers SL1 and SL3 may extend to overlap the cell stacked body STc and the dummy stacked body STd. The second source layer SL2 may be disposed between the first source layer SL1 and the cell stacked body STc. The third source layer SL3 may be omitted in some cases.

Each of the first source layer SL1 and the second source layer SL2 may include a doped semiconductor layer. The doped semiconductor layer may include source dopants. For example, the source dopants may be n-type impurities. The third source layer SL3 may include at least one of a doped semiconductor layer and an undoped semiconductor layer. The third source layer SL3 may be penetrated by the source contact structures SCT1 and SCT2. The source contact structures SCT1 and SCT2 may extend from the second source layer SL2 or from the first source layer SL1.

The first and second vertical barriers VB1 and VB2, the cell plugs CPL, and the dummy plugs DPL may have the same material layers. Each of the first and second vertical barriers VB1 and VB2 may include a semiconductor pattern SE, dielectric layers MLd and MLc enclosing the semiconductor pattern SE, and a second core insulating layer CO2 enclosed by the semiconductor pattern SE. Each cell plug CPL may include a channel structure CH, dielectric layers MLa and MLb enclosing the channel structure CH, and a first core insulating layer CO1 enclosed by the channel structure CH.

The semiconductor pattern SE and the channel structure CH may be simultaneously formed, and may be formed of the same material layers. The first core insulating layer CO1 and the second core insulating layer CO2 may be simultaneously formed, and may be formed of the same material layer. Each of the semiconductor pattern SE and the channel structure CH may include a channel layer CL and a doped layer DL. The channel layer CL may be formed of a semiconductor layer. For example, the channel layer CL may be formed of a silicon layer. The channel layer CL may extend along an outer wall of the first core insulating layer CO1 or the second core insulating layer CO2 corresponding thereto. The doped layer DL may overlap the first core insulating layer CO1 or the second core insulating layer CO2 corresponding thereto. The doped layer DL may be coupled to the channel layer CL corresponding thereto. The doped layer DL may be formed of a doped semiconductor layer. For example, the doped layer DL may be formed of an n-type doped silicon layer. The channel layer CL of the channel structure CH may be used as a channel region of a cell string, and the doped layer DL of the channel structure CH may be used as a drain junction of the cell string.

The dummy plug DPL may include a dummy channel layer DCL, dummy dielectric layers DMLa and DMLb enclosing the dummy channel layer DCL, and a dummy core insulating layer DCO enclosed by the dummy channel layer DCL. The dummy plug DPL may overlap a separation insulating layer SIL disposed on the dummy core insulating layer DCO to fill the second slit SI2. The dummy channel layer DCL may be formed simultaneously with the channel layer CL, and may be formed of the same material layer as the channel layer CL. The dummy core insulating layer DCO may be formed simultaneously with the first core insulating layer CO1 and the second core insulating layer CO2, and may be formed of the same material layer as the first and second core insulating layers CO1 and CO2.

The dielectric layers MLc and MLd of the first and second vertical barriers VB1 and VB2 may include an inner wall dielectric layer MLc and an outer wall dielectric layer MLd. The inner wall dielectric layer MLc may contact a sidewall of the dummy stacked body STd, and the outer wall dielectric layer MLd may contact a sidewall of the cell stacked body STc. Each of the inner wall dielectric layer MLc and the outer wall dielectric layer MLd may extend along an outer wall of the semiconductor pattern SE. The inner wall dielectric layer MLc may be disposed between the semiconductor pattern SE and the dummy stacked body STd, and the outer wall dielectric layer MLd may be disposed between the semiconductor pattern SE and the cell stacked body STc. Each of the inner wall dielectric layer MLc and the outer wall dielectric layer MLd may extend to a space between each of the third source layer SL3, the second source layer SL2, and the first source layer SL1 of the source structure SL and the semiconductor pattern SE.

The dielectric layers MLa and MLb of the cell plug CPL may include a memory layer MLa and a first dummy layer MLb. Each of the memory layer MLa and the first dummy layer MLb may extend along an outer wall of the channel structure CH. The memory layer MLa may be disposed between the cell stacked body STc and the channel structure CH, and the first dummy layer MLb may be disposed between the first source layer SL1 and the channel structure CH. The memory layer MLa and the first dummy layer MLb may be separated from each other by the second source layer SL2 of the source structure SL extended to contact the channel structure CH.

The dummy dielectric layers DMLa and DMLb of the dummy plug DPL may include a second dummy layer DMLa and a third dummy layer DMLb. Each of the second dummy layer DMLa and the third dummy layer DMLb may extend along an outer wall of the dummy channel layer DCL. The second dummy layer DMLa may be disposed between the cell stacked body STc and the dummy channel layer DCL, and the third dummy layer DMLb may be disposed between the first source layer SL1 of the source structure SL and the dummy channel layer DCL. The second dummy layer DMLa may extend to enclose a sidewall of the separation insulating layer SIL. The second dummy layer DMLa and the third dummy layer DMLb may be separated from each other by the second source layer SL2 of the source structure SL extended to contact the dummy channel layer DCL.

The above-described dielectric layers MLc, MLd, MLa, MLb, DMLa, and DMLb may be simultaneously formed, and may be formed of the same material layers.

The dummy stacked body STd may include a first stacked body STd1 and a second stacked body STd2 formed on the first stacked body STd1. Each of the first stacked body STd1 and the second stacked body STd2 may include dummy interlayer insulating layers ILD' and sacrificial insulating layers SC, which are alternately stacked. Each of the first and second vertical barriers VB1 and VB2 may be divided into a first portion P1 formed on the sidewall of the first stacked body STd1 and a second portion P2 formed on the sidewall of the second stacked body STd2. At the height at which a boundary surface between the first stacked body STd1 and the second stacked body STd2 is disposed, the first portion P1 and the second portion P2 may have different cross-sectional areas. In an embodiment, at the height at which a boundary surface between the first stacked body STd1 and the second stacked body STd2 is disposed, the cross-sectional area of the first portion P1 may be wider than that of the second portion P2.

The cell stacked body STc includes interlayer insulating layers ILD and conductive patterns CP1 to CPn which are alternately stacked. The cell stacked body STc may be disposed at the same height as the dummy stacked body STd. The interlayer insulating layers ILD may be disposed at the same levels as the dummy interlayer insulating layers ILD, and the conductive patterns CP1 to CPn may be disposed at the same levels as the sacrificial insulating layers SC.

The interlayer insulating layers ILD and the dummy interlayer insulating layers ILD' may be made of the same material, and may be formed through the same process. The sacrificial insulating layers SC may be formed of a material having an etch rate different from that of the interlayer insulating layers ILD and the dummy interlayer insulating layers ILD'. For example, the interlayer insulating layers ILD and the dummy interlayer insulating layers ILD' may include silicon oxide, and the sacrificial insulating layers SC may include silicon nitride.

Each of the conductive patterns CP1 to CPn may include various conductive materials, such as a doped silicon layer, a metal layer, a metal silicide layer and may include two or more kinds of conductive materials. Each of the conductive patterns CP1 to CPn may further include a barrier layer. For example, each of the conductive patterns CP1 to CPn may include tungsten and a titanium nitride layer (TiN) configured to enclose the surface of tungsten. Tungsten may be low-resistance metal, and may decrease the resistance of the conductive patterns CP1 to CPn. The titanium nitride layer TiN may be a barrier layer, and may prevent or mitigate tungsten and the interlayer insulating layers ILD from directly contacting each other.

The conductive patterns CP1 to CPn may be used as gate electrodes of a cell string. The gate electrodes of the cell string may include source select lines, word lines, and drain select lines. The source select lines may be used as gate electrodes of source select transistors, the drain select lines may be used as gate electrodes of drain select transistors, and the word lines may be used as gate electrodes of memory cells.

For example, among the conductive patterns CP1 to CPn, first and second conductive patterns CP1 and CP2 disposed closer to the source structure SL may be used as source select lines. Among the conductive patterns CP1 to CPn, n-th and n−1-th conductive patterns CPn and CPn−1 disposed farthest from the source structure SL may be used as drain select lines. Embodiments of the present disclosure are not limited thereto. For example, among the second conductive pattern CP2 to the n−1-th conductive pattern CPn−1 between the first conductive pattern CP1 and the n-th conductive pattern CPn, one or more conductive patterns that are successively stacked adjacent to the first conductive pattern CP1 may be used as different source select lines, respectively. Also, among the second conductive pattern CP2 to the n−1-th conductive pattern CPn−1, one or more conductive patterns that are successively stacked adjacent to the n-th conductive pattern CPn may be used as different drain select lines, respectively. The second slit SI2 and the separation insulating layer SIL may separate conductive patterns (e.g., CPn and CPn−1) used as drain select lines into drain select lines of a first group and drain select lines of a second group, which may be separately controlled. Furthermore, a source select line separation structure SSM may separate conductive patterns (e.g., CP1 and CP2) used as source select lines into source select lines of a first group and source select lines of a second group, which may be separately controlled.

Among the conductive patterns CP1 to CPn, conductive patterns disposed between the source select lines and the drain select lines may be used as word lines.

Figure 4:
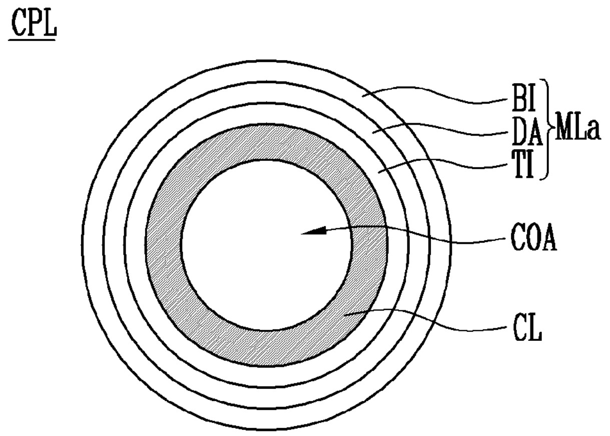
FIG. 4 is a view illustrating the cross-section of a cell plug illustrated in FIG. 3A.

FIG. 4 is a view illustrating the cross-section of the cell plug illustrated in FIG. 3A.

Referring to FIG. 4, the channel layer CL of the cell plug CPL may be formed in a ring shape for defining a core area COA. The core area COA may be filled with the doped layer DL, described above with reference to FIG. 3A, or with the first core insulating layer CO1, described above with reference to FIG. 3A. The memory layer MLa of the cell plug CPL may include a tunnel insulating layer TI, a data storage layer DA, and a blocking insulating layer BI which are sequentially stacked on the surface of the channel layer CL.

The data storage layer DA may be formed of a material layer capable of storing changed data using Fowler-Nordheim tunneling. For this, the data storage layer DA may be formed of various materials, for example, a nitride layer enabling charge trap. The present disclosure is not limited thereto, and the data storage layer DA may include silicon, a phase-change material, nanodots, etc. The blocking insulating layer BI illustrated in FIG. 4 may include an oxide layer capable of blocking charges. The tunnel insulating layer TI illustrated in FIG. 4 may be formed of a silicon oxide layer that enables charge tunneling.

Figure 5:
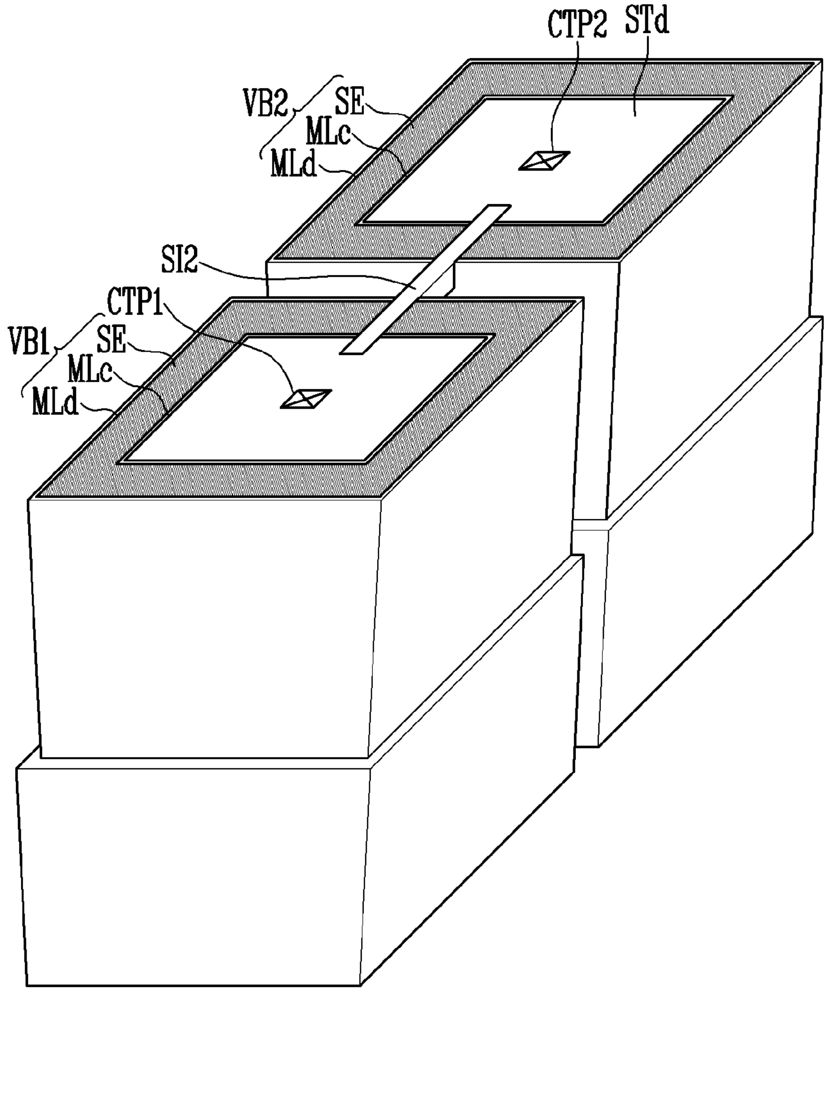
FIG. 5 is a view illustrating vertical barriers illustrated in FIG. 2.

FIG. 5 is a view illustrating the vertical barriers illustrated in FIG. 2.

Referring to FIG. 5, first and second vertical barriers VB1 and VB2 may extend along sidewalls of a dummy stacked body STd penetrated by a first contact plug CTP1 and a second contact plug CTP2, respectively. Each of the first and second vertical barriers VB1 and VB2 may have the shape of a rectangular frame.

Respective inner wall dielectric layers MLc of the first and second vertical barriers VB1 and VB2 may extend to enclose the sidewalls of the dummy stacked body STd. Respective semiconductor patterns SE of the first and second vertical barriers VB1 and VB2 may extend to enclose inner wall dielectric layers MLc. Respective outer wall dielectric layers MLd of the first and second vertical barriers VB1 and VB2 may extend to enclose the semiconductor patterns SE while facing the inner wall dielectric layers MLc.

The first vertical barrier VB1 and the second vertical barrier VB2 may be disposed to be spaced apart from each other by a certain distance. Portions of sidewalls of the first vertical barrier VB1 and the second vertical barrier VB2 facing each other may be penetrated by the second slit SI2 to a certain depth.

Figure 6:
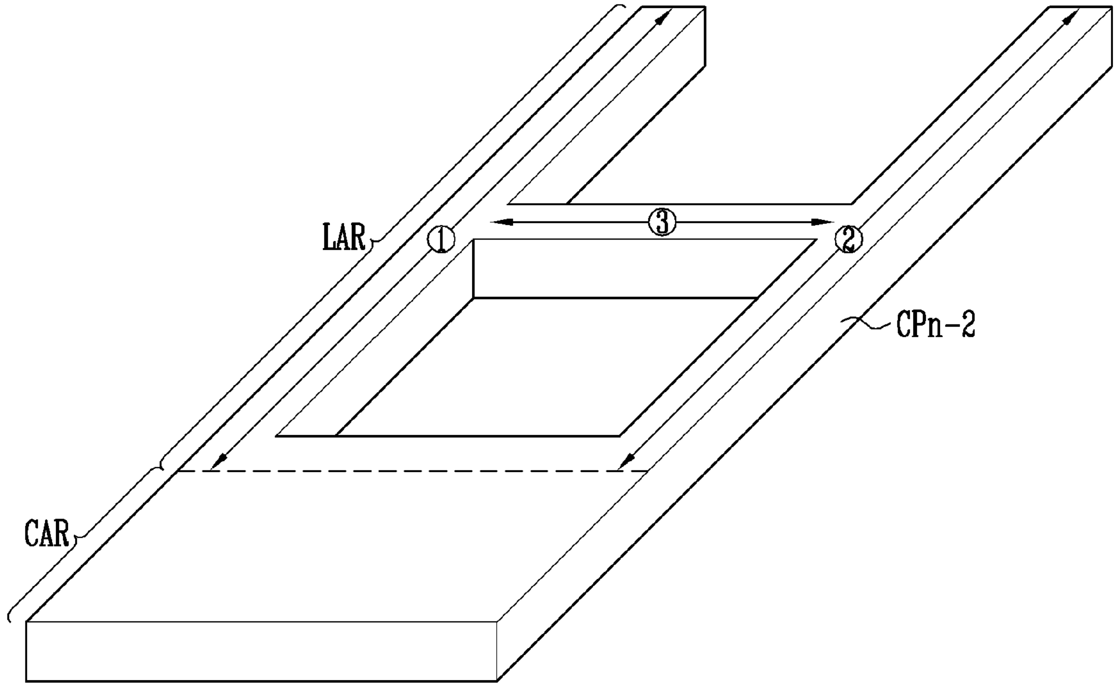
FIG. 6 is a view for explaining a conductive pattern for word lines illustrated in FIG. 2.

FIG. 6 is a view for explaining a conductive pattern for word lines illustrated in FIG. 2.

FIG. 6 is a diagram illustrating any one (e.g., conductive pattern CPn−2) of conductive patterns (e.g., CP3 to CPn−2) used as word lines, among the plurality of conductive patterns CP1 to CPn illustrated in FIG. 2.

Referring to FIG. 6, the conductive pattern CPn−2 may be disposed over a cell array area CAR and a connection area LAR. Although not illustrated in the drawing, the conductive pattern CPn−2 disposed in the cell array area CAR is penetrated by cell plugs. The conductive pattern CPn−2 disposed in the connection area LAR includes a plurality of extensions ① and ② that extend in a linear shape and are parallel to each other, and a connector ③ that extends in a direction perpendicular to the extension direction of the plurality of extensions ① and ② to connect the extensions ① and ② to each other.

In an embodiment, the total volume of the conductive pattern CPn−2 may be increased due to the connector ③, and thus the resistance of the word line may be reduced. Further, even if some of the plurality of extensions ① and ② are disconnected due to a process failure, a current path may be generated by the connector ③, and thus, in an embodiment, word line failures may be decreased.

The conductive pattern CPn−2 disposed in the connection area LAR may have an H-shape or a ladder shape.

Figure 7A:
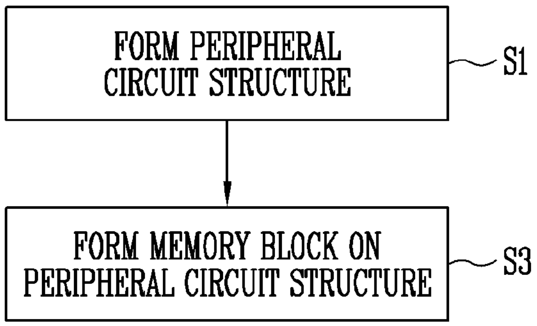
FIGS. 7A and 7B are flowcharts schematically illustrating a method of manufacturing a semiconductor memory device according to embodiments of the present disclosure.
Figure 7B:
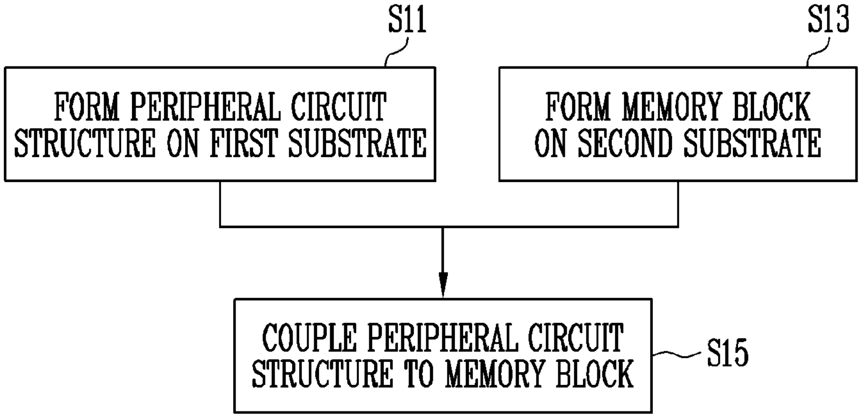

FIGS. 7A and 7B are flowcharts schematically illustrating a method of manufacturing a semiconductor memory device according to embodiments of the present disclosure.

Referring to FIG. 7A, the method of manufacturing a semiconductor memory device according to an embodiment may include step S1 of forming a peripheral circuit structure on a substrate, and step S3 of forming a memory block on the peripheral circuit structure.

The substrate provided at step S1 may be the substrate SUB, described above with reference to FIGS. 3A and 3B. The peripheral circuit structure formed at step S1 may be the peripheral circuit structure PC, described above with reference to FIGS. 3A and 3B.

The memory block formed at step S3 may include the source structure SL, the cell stacked body STc, and the dummy stacked body STd, described above with reference to FIGS. 3A and 3B.

Referring to FIG. 7B, the method of manufacturing the semiconductor memory device according to an embodiment may include step S11 of forming a peripheral circuit structure on a first substrate, step S13 of forming a memory block on a second substrate, and step S15 of coupling the peripheral circuit structure to the memory block.

The first substrate provided at step S11 may be the substrate SUB, described above with reference to FIGS. 3A and 3B. The peripheral circuit structure formed at step S11 may be the peripheral circuit structure PC, described above with reference to FIGS. 3A and 3B.

The memory block formed at step S13 may include the source structure SL, the cell stacked body STc, and the dummy stacked body STd, described above with reference to FIGS. 3A and 3B.

Step S15 may be a process of coupling the peripheral circuit structure formed at step S11 to the memory block formed at step S13. In an embodiment, step S15 may be performed such that pads included in the peripheral circuit structure and pads included in the memory block are adhered to each other.

Figure 8A:
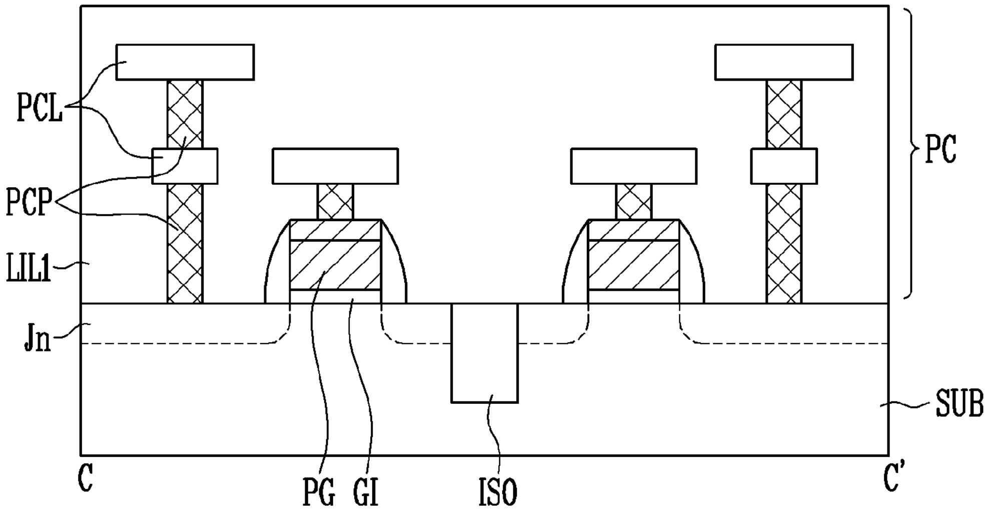
FIGS. 8A and 8B are views illustrating the step of providing a lower structure according to embodiments of the present disclosure.
Figure 8B:

FIGS. 8A and 8B are views illustrating the step of providing a lower structure according to embodiments of the present disclosure.

According to the embodiment illustrated in FIG. 8A, the lower structure may be a substrate SUB on which the peripheral circuit structure PC is formed at step S1 illustrated in FIG. 7A. Because the configurations of the substrate SUB and the peripheral circuit structure PC overlap those described with reference to FIGS. 3A and 3B, descriptions thereof will be omitted.

According to the embodiment of FIG. 8B, the lower structure may be a second substrate 101 provided at step S13 illustrated in FIG. 7B.

FIGS. 9A to 9F are sectional views illustrating a process of forming a memory block of a semiconductor memory device according to an embodiment of the present disclosure. In detail, FIGS. 9A to 9F are sectional views of the semiconductor memory device taken along line C-C' so as to indicate a process of forming structures in the connection area LAR of FIG. 2.

The processes illustrated in FIGS. 9A to 9F may be performed such that a memory block is formed on the lower structure illustrated in FIG. 8A or 8B.

Figure 9A:
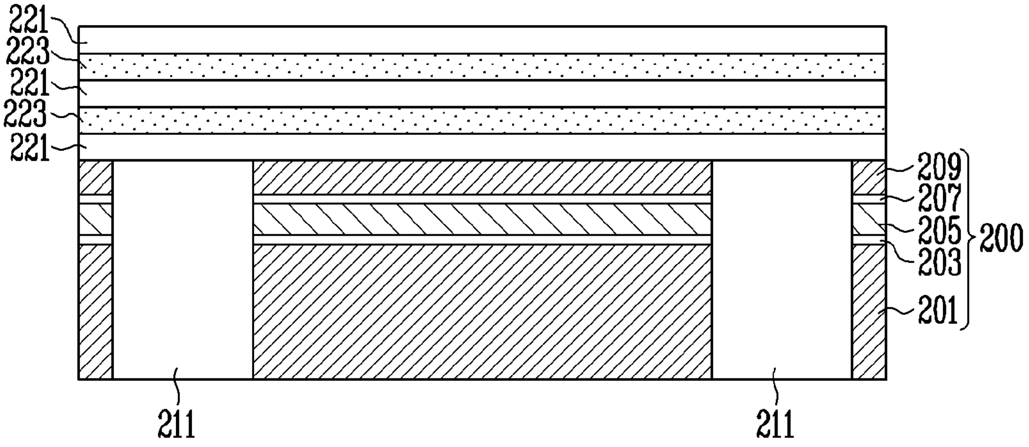
FIGS. 9A, 9B, 9C, 9D, 9E, and 9F are sectional views illustrating a process of forming a memory block of a semiconductor memory device according to an embodiment of the present disclosure.

Referring to FIG. 9A, a source stacked body 200 may be formed on the peripheral circuit structure PC illustrated in FIG. 8A or on the second substrate 101 illustrated in FIG. 8B. The source stacked body 200 may include a first doped semiconductor layer 201, a first protective layer 203, a sacrificial source layer 205, a second protective layer 207, and an etch stop layer 209, which are sequentially stacked.

The first doped semiconductor layer 201 may form the first source layer SL1, described above with reference to FIGS. 3A and 3B. The first doped semiconductor layer 201 may include a doped silicon layer. The first doped semiconductor layer 201 may include source dopants. For example, the source dopants may be n-type impurities.

Each of the first protective layer 203 and the second protective layer 207 may be formed of a material having an etch rate different from that of the first doped semiconductor layer 201, the sacrificial source layer 205, and the etch stop layer 209. For example, each of the first protective layer 203 and the second protective layer 207 may include an oxide layer. The sacrificial source layer 205 may be formed of a material having an etch rate different from that of the first doped semiconductor layer 201 and the etch stop layer 209. For example, the etch stop layer 209 may contain undoped silicon.

The etch stop layer 209 may form the third source layer SL3, described above with reference to FIGS. 3A to 3C. The etch stop layer 209 may be formed of a material having an etch rate different from those of first material layers 221 and second material layers 223, which will be subsequently formed. For example, the etch stop layer 209 may include a doped silicon layer containing source dopants.

Subsequently, lower insulating layers 211 penetrating the source stacked body 200 may be formed. The lower insulating layers 211 may form the second lower insulating layer LIL2, described above with reference to FIG. 3C. The second lower insulating layer LIL2 may be disposed in an area in which the first and second contact plugs CTP1 and CTP2 of FIG. 2 are to be formed.

Thereafter, the first material layers 221 and the second material layers 223 are alternately stacked on the source stacked body 200. The first material layers 221 and the second material layers 223 may extend to cover the lower insulating layers 211. The first material layers 221 may form the interlayer insulating layers ILD and the dummy interlayer insulating layers ILD', described above with reference to FIGS. 3A to 3C. The second material layers 223 may be formed of a material having an etch rate different from that of the first material layers 221. For example, the first material layers 221 may include silicon oxide, and the second material layers 223 may include silicon nitride. The second material layers 223 may form the sacrificial insulating layers SC, described above with reference to FIG. 3A. Here, sacrificial insulating layers SC of a number corresponding to the number of source select lines may be stacked.

Figure 9B:
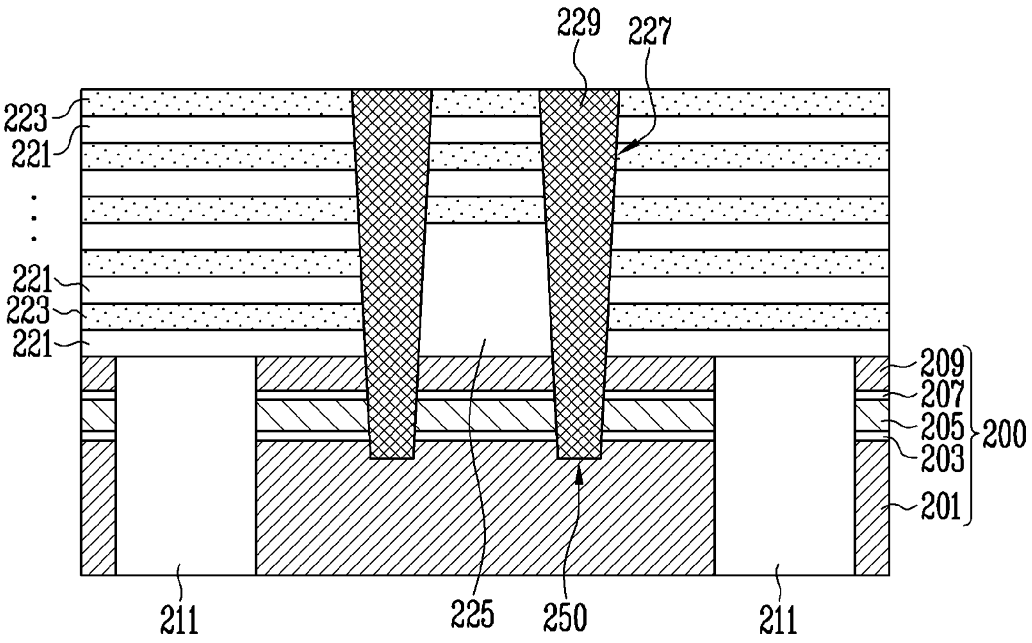

Referring to FIG. 9B, a trench may be formed by etching the first material layers 221 and the second material layers 223, and a separation structure 225 may be formed by filling the trench with an insulating material. The separation structure 225 may form the source select line separation structure SSM, described above with reference to FIG. 3C.

Thereafter, the second material layers 223 and the first material layers 221 are alternately stacked on the separation structure 225 and the corresponding first material layer 221. The first material layers 221 and the second material layers 223 may form the first stacked body STd1 of the dummy stacked body STd, described above with reference to FIG. 3C.

Subsequently, a first trench 227 passing through the first material layers 221 and the second material layers 223 is formed. The first trench 227 may pass through the etch stop layer 209, the second protective layer 207, the sacrificial source layer 205, and the first protective layer 203, and may extend into the first doped semiconductor layer 201. The first trench 227 may define an area in which the first portions P1 of the first and second vertical barriers VB1 and VB2, described above with reference to FIG. 3C, are to be formed. The first trench 227 may have the shape of two rectangular frames on a plan view. Due to the characteristics of an etching process of forming the first trench 227, the sidewalls of the first trench 227 may be formed to be inclined, and the width of the first trench 227 may be smaller in a direction closer to the first doped semiconductor layer 201. Because the height of a stack of the first material layers 221 and the second material layers 223 is controlled to be lower than the height of a target cell string, the first doped semiconductor layer 201 may be opened by the bottom surface of the first trench 227 even if the width of the first trench 227 is not excessively increased.

A process of forming the first trench 227 may be performed simultaneously with a process of forming lower holes in the cell array area CAR illustrated in FIG. 2. The lower holes define an area in which the cell plugs CPL of the cell array area CAR illustrated in FIG. 2 are to be formed. Further, first dummy holes may be formed in the cell array area CAR illustrated in FIG. 2 while the first trench 227 and the lower holes are being formed. The first dummy holes define an area in which the dummy cell plugs DPL of the cell array area CAR illustrated in FIG. 2 are to be formed.

Thereafter, a filling pattern 229 that fills the first trench 227 may be formed. The filling pattern 229 may be made of a material having an etch selectivity with respect to the first and second material layers 221 and 223. For example, the filling pattern 229 may include metal, barrier metal, polysilicon, or the like. The filling pattern 229 may be made of a single material or different types of materials. At the step of forming the filing pattern 229, the lower holes and the first dummy holes formed in the cell array area CAR illustrated in FIG. 2 may be filled with cell-filling patterns made of the same material as the filling pattern 229.

Figure 9C:
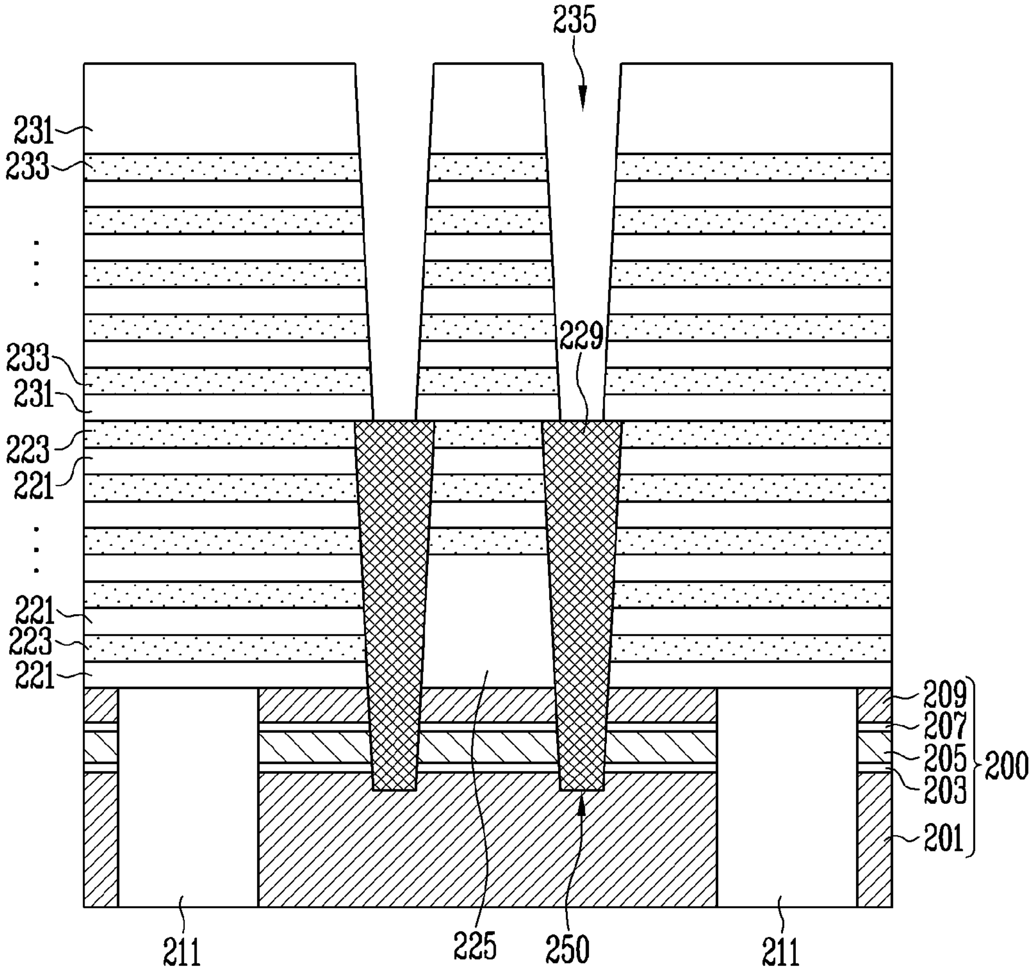

Referring to FIG. 9C, third material layers 231 and fourth material layers 233 may be alternately stacked on the first material layers 221 and the second material layers 223 penetrated by the filling pattern 229. The third material layers 231 may be formed of the same material as the first material layers 221, described above with reference to FIGS. 9A and 9B, and the fourth material layers 233 may be formed of the same material as the second material layers 223, described above with reference to FIGS. 9A and 9B. The third material layers 231 may form the interlayer insulating layers ILD and the dummy interlayer insulating layers ILD', described above with reference to FIG. 3C. The fourth material layers 233 may form the sacrificial insulating layers SC, described above with reference to FIG. 3C. The third material layers 231 and the fourth material layers 233 may form the second stacked body STd2 of the dummy stacked body STd, described above with reference to FIG. 3C.

Subsequently, a second trench 235 passing through the third material layers 231 and the fourth material layers 233 is formed. The second trench 235 may be formed to expose the filling pattern 229. The second trench 235 may define an area in which the second portion P2 of the vertical barrier VB, described above with reference to FIG. 3C, is to be formed.

A process of forming the second trench 235 may be performed simultaneously with a process of forming upper holes in the cell array area CAR illustrated in FIG. 2. The upper holes define an area in which the cell plugs CPL of the cell array area CAR illustrated in FIG. 2 are to be formed. Further, second dummy holes may be formed in the cell array area CAR illustrated in FIG. 2 while the second trench 235 and the upper holes are being formed. The second dummy holes define an area in which the dummy cell plugs DPL of the cell array area CAR illustrated in FIG. 2 are to be formed. Although not illustrated in the drawing, the upper holes and the second dummy holes may expose cell-filling patterns formed in the cell array area CAR illustrated in FIG. 2.

Due to the characteristics of an etching process of forming the second trench 235, the sidewalls of the second trench 235 may be formed to be inclined, and the width of the second trench 235 may be smaller in a direction closer to the filling pattern 229. Because the height of a stack of the third material layers 231 and the fourth material layers 233 is controlled to be lower than the height of a target cell string, the filling pattern 229 may be opened by the bottom surface of the second trench 235 even if the width of the second trench 235 is not excessively increased.

Figure 9D:
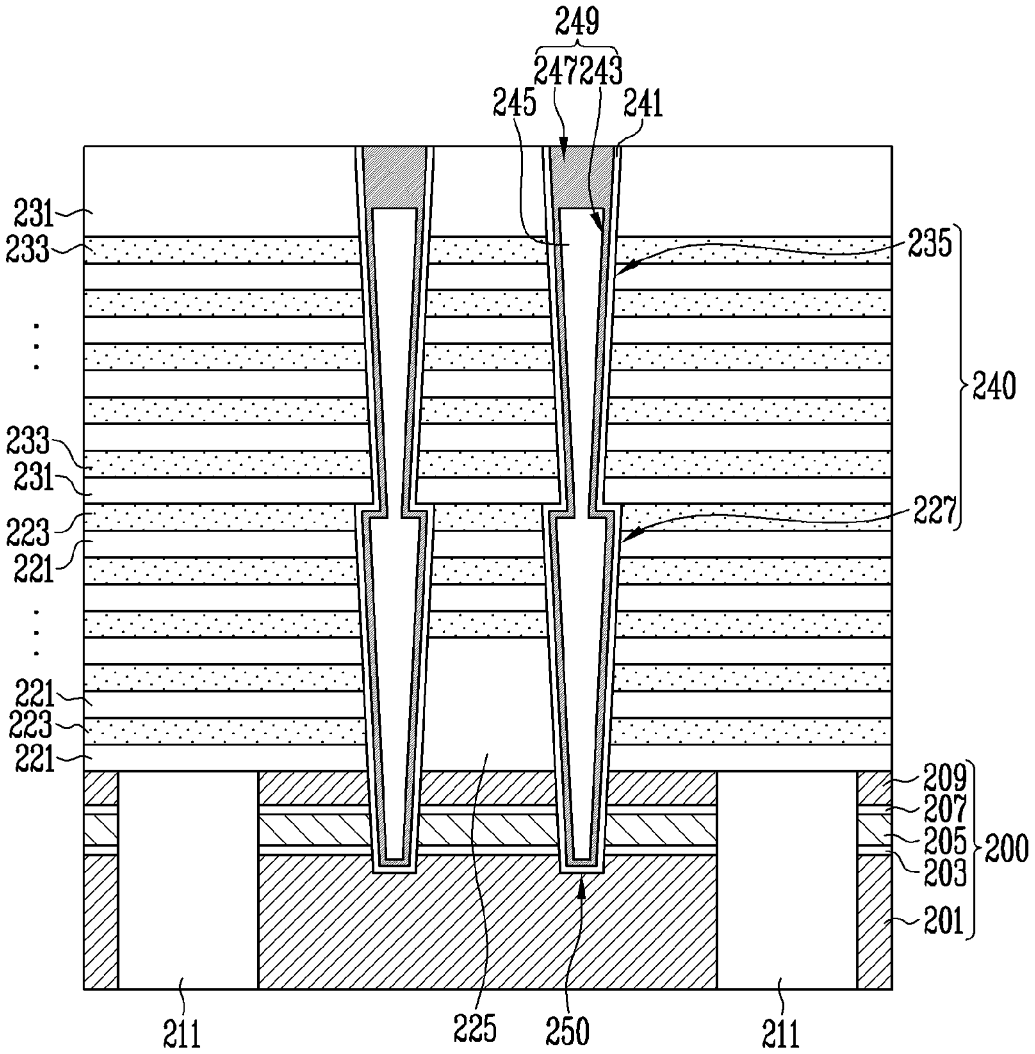

Referring to FIG. 9D, the first trench 227 may be opened by removing the filling pattern 229 illustrated in FIG. 9C through the second trench 235. Accordingly, an opening 240 including the first trench 227 and the second trench 235 may be defined. While the filling pattern 229 is being removed, cell-filling patterns, described above with reference to FIG. 9B, may be removed. Accordingly, the channel holes for defining the area in which the cell plugs CPL illustrated in FIG. 2 are to be disposed and the dummy holes for defining the area in which dummy plugs DPL are to be disposed may be completely opened.

Subsequently, a vertical barrier 250 may be formed in the opening 240. The step of forming the vertical barrier 250 may be performed using the step of forming the cell plugs CPL and the dummy plugs DPL in the cell array area CAR illustrated in FIG. 2. For example, the step of forming the vertical barrier 250 may include the step of forming a dielectric layer 241 on the surface of the opening 240 and the step of filling a central portion of the opening 240 exposed by the dielectric layer 241 with a semiconductor pattern 249. As described above with reference to FIG. 4, the dielectric layer 241 may include a blocking insulating layer BI, a data storage layer DA, and a tunnel insulating layer TI. The step of forming the semiconductor pattern 249 may include the step of forming a channel layer 243 on the surface of the dielectric layer 241 and the step of filling the central portion of the opening 240 exposed by the channel layer 243 with a core insulating layer 245 and a doped layer 247. The channel layer 243 may include a silicon layer. The core insulating layer 245 may include oxide. The doped layer 247 may include an n-type doped silicon layer.

In the above-described embodiment, although the vertical barrier 250 is formed by filling the opening 240 with the same material as the cell plugs CPL and the dummy plugs DPL, the vertical barrier 250 may be formed by filling the opening 240 with an insulating material in other embodiments.

Figure 9E:
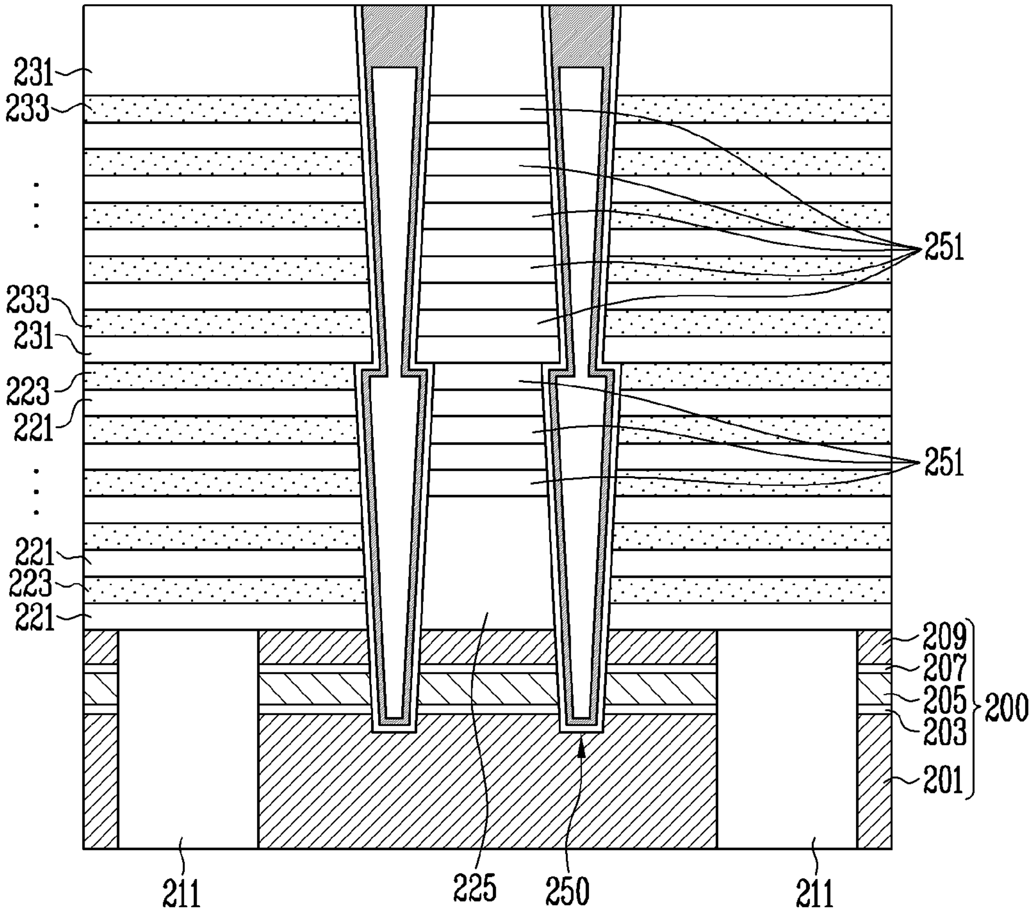

Referring to FIG. 9E, slits (not illustrated) passing through the first to fourth material layers 221, 223, 231, and 233 may be formed, thus enabling sidewalls of the first to fourth material layers 221, 223, 231, and 233 to be exposed. The slits may form some of the first slits SI1 of FIG. 2, and may be formed in the same layout as the first slits SI1 illustrated in FIG. 2.

The vertical barrier 250 may be formed in the opening (e.g., 240 of FIG. 9D) formed through separate processes corresponding to the process of forming the first trench 227, described above with reference to FIG. 9B, and the process of forming the second trench 235, described above with reference to FIG. 9C.

Thereafter, the second material layers 223 and the fourth material layers 233, which are exposed through slits (not illustrated), may be removed by performing an etching process. In an embodiment, the second material layers 223 and the fourth material layers 233 may constitute sacrificial layers. Thus, between the vertical barriers 250, gate regions 251 may be opened between first material layers 221 neighboring each other in a stacking direction between the first material layers 221 and the third material layers 231 neighboring each other in the stacking direction, and between the third material layers 231 neighboring each other in the stacking direction.

While an etching process of opening the gate regions 251 is being performed, the vertical barrier 250 may prevent or mitigate the inflow of an etching material. Accordingly, the second material layers 223 and the fourth material layers 233 protected by the vertical barrier 250 may remain to configure a dummy stacked body (e.g., STd of FIG. 3C). The dummy stacked body may include the first to fourth material layers 221, 223, 231, and 233 overlapping the lower insulating layers 211. The vertical barrier 250 may function as a support while an etching process of opening the gate regions 251 is being performed.

Figure 9F:
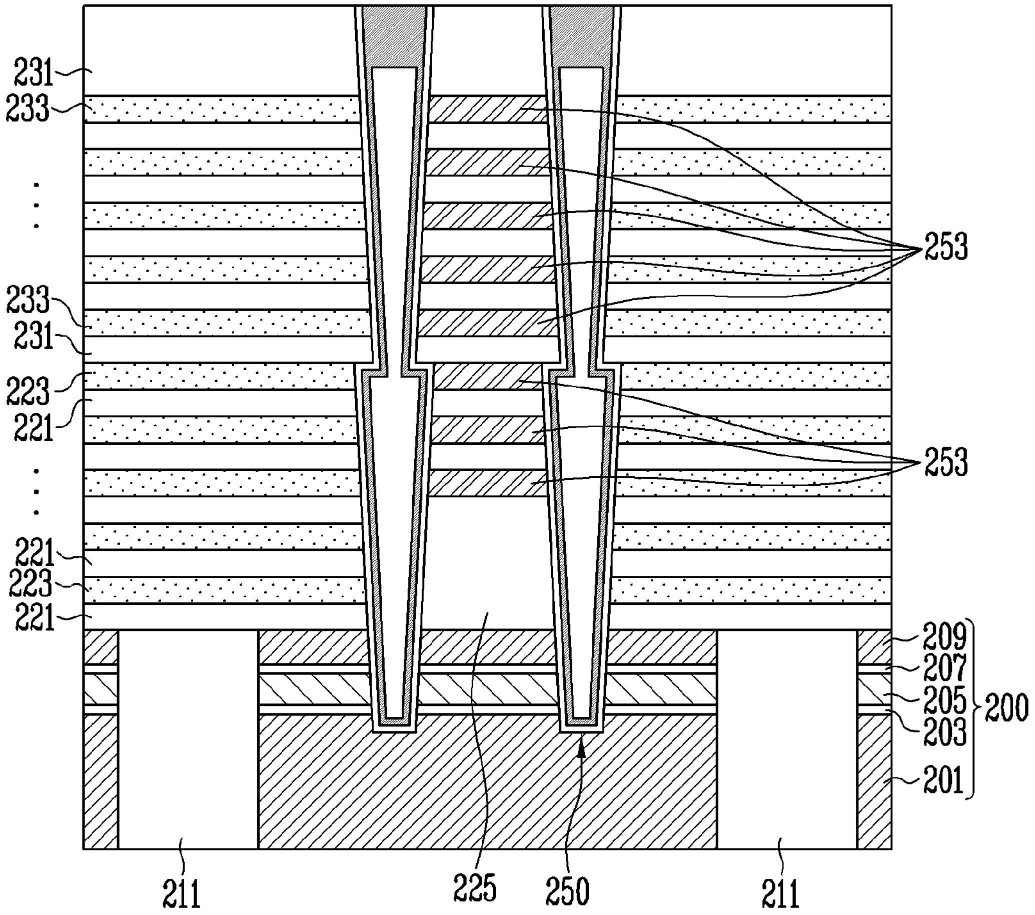

Referring to FIG. 9F, the gate regions 251 illustrated in FIG. 9E are filled with conductive patterns 253. The conductive patterns 253 may form the cell stacked body STc, described above with reference to FIGS. 3A to 3C.

The step of forming the conductive patterns 253 may include the step of injecting a conductive material through slits to fill the gate regions 251 illustrated in FIG. 9E and the step of removing a portion of the conductive material in the slits so that the conductive material is separated into the conductive patterns 253. The vertical barrier 250 may block or mitigate the inflow of the conductive material.

Each of the conductive patterns 253 may include at least one of a doped silicon layer, a metal silicide layer, and a metal layer. Each of the conductive patterns 253 may include low-resistance metal such as tungsten to implement a low-resistance line. Each of the conductive patterns 253 may further include a barrier layer such as a titanium nitride layer, a tungsten nitride layer, or a tantalum nitride layer.

The conductive patterns 253 may be formed in an H shape on the same layer, as described above with reference to FIG. 6. When a process of filling the gate regions 251 with a conductive material to form the conductive patterns 253 is performed, the conductive material may be filled in a space between adjacent vertical barriers 250, and then the connector ③ of FIG. 6 may be formed.

Figure 10:
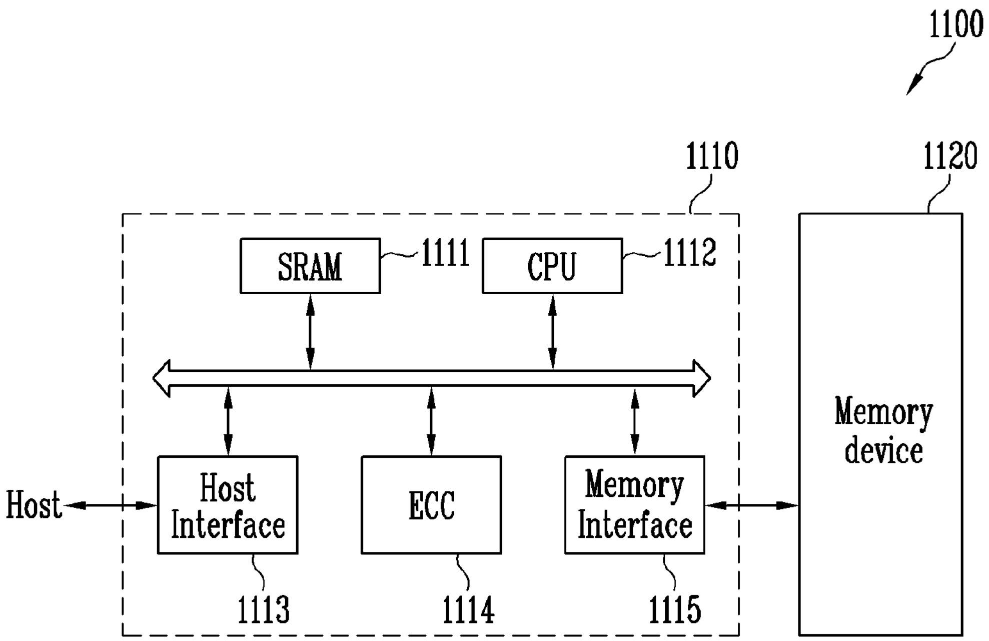
FIG. 10 is a block diagram illustrating the configuration of a memory system according to an embodiment of the present disclosure.

FIG. 10 is a block diagram illustrating the configuration of a memory system according to an embodiment of the present disclosure.

Referring to FIG. 10, a memory system 1100 according to an embodiment of the present disclosure includes a memory device 1120 and a memory controller 1110.

The memory device 1120 may be a multi-chip package including a plurality of flash memory chips.

The memory controller 1110 may control the memory device 1120, and may include a static random access memory (SRAM) 1111, a central processing unit (CPU) 1112, a host interface 1113, an error correction code (ECC) 1114, and a memory interface 1115. The SRAM 1111 may be used as a working memory of the CPU 1112, the CPU 1112 may perform overall control operations for data exchange of the memory controller 1110, and the host interface 1113 may be provided with a data exchange protocol of a host coupled to the memory system 1100. Further, the ECC 1114 may detect and correct an error included in the data that is read from the memory device 1120, and the memory interface 1115 may perform interfacing with the memory device 1120. In addition, the memory controller 1110 may further include a read only memory (ROM) or the like that stores code data for interfacing with the host.

The above-described memory system 1100 may be a memory card or a solid state drive (SSD) in which the memory device 1120 and the memory controller 1110 are combined with each other. For example, when the memory system 1100 is an SSD, the memory controller 1110 may communicate with an external device (e.g., host) through one of various interface protocols, such as a universal serial bus (USB), a multimedia card (MMC), a peripheral component interconnection-express (PCI-E), a serial advanced technology attachment (SATA), a parallel advanced technology attachment (PATA), a small computer system interface (SCSI), an enhanced small disk interface (ESDI), or an Integrated Drive Electronics (IDE).

Figure 11:
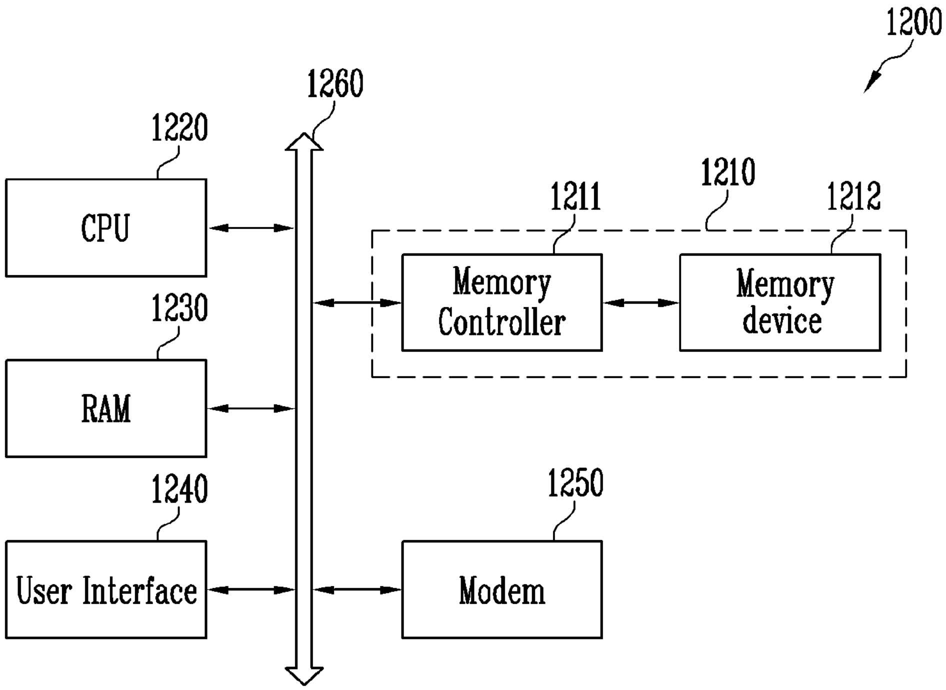
FIG. 11 is a block diagram illustrating the configuration of a computing system according to an embodiment of the present disclosure.

FIG. 11 is a block diagram illustrating the configuration of a computing system according to an embodiment of the present disclosure.

Referring to FIG. 11, a computing system 1200 according to an embodiment of the present disclosure may include a CPU 1220, a random access memory (RAM) 1230, a user interface 1240, a modem 1250, and a memory system 1210, which are electrically connected to a system bus 1260. Also, when the computing system 1200 is a mobile device, it may further include a battery for supplying an operating voltage to the computing system 1200, and may further include an application chip set, a camera image processor (CIS), a mobile DRAM, etc.

The memory system 1210 may include a memory device 1212 and a memory controller 1211.

Embodiments of the present disclosure may reduce the resistance of each word line and solve a problem in which a word line is disconnected due to a process failure by connecting parallel conductive patterns for word lines arranged in a connection area adjacent to a cell array area to each other.

The embodiments disclosed in the present specification and the drawings just aims to help those with ordinary knowledge in this art more clearly understand the present disclosure rather than aiming to limit the bounds of the present disclosure. It should be understood that many variations and modifications of the basic concepts described herein will still fall within the spirit and scope of the present disclosure as defined in the appended claims and their equivalents.

Unless otherwise defined, all terms including technical and scientific terms used herein have the same meaning as commonly understood by one of ordinary skill in the art to which the present disclosure pertains. Unless otherwise defined in the present disclosure, the terms should not be construed as being ideal or excessively formal.

What is claimed is:

1. A semiconductor memory device, comprising:

a first dummy stacked body and a second dummy stacked body formed in a connection area of a substrate including a cell array area and the connection area;

a cell stacked body disposed in the cell array area and the connection area and configured to enclose the first dummy stacked body and the second dummy stacked body; and a first vertical barrier disposed at a boundary between the cell stacked body and the first dummy stacked body and a second vertical barrier disposed at a boundary between the cell stacked body and the second dummy stacked body, wherein the cell stacked body comprises first and second extensions disposed to extend in substantially a linear shape in the connection area and a connector configured to connect the first and second extensions to each other, and wherein the cell stacked body, the first dummy stacked body, and the second dummy stacked body are sequentially arranged in a first direction.

2. The semiconductor memory device according to claim 1, wherein the first vertical barrier and the second vertical barrier are disposed in the connection area and spaced apart from each other.

3. The semiconductor memory device according to claim 2, wherein each of the first vertical barrier and the second vertical barrier has a shape of a rectangular frame.

4. The semiconductor memory device according to claim 2, wherein the connector is disposed in a space between the first vertical barrier and the second vertical barrier.

5. The semiconductor memory device according to claim 1, wherein the first vertical barrier comprises:

an inner wall dielectric layer extending to enclose a sidewall of the first dummy stacked body;

a semiconductor pattern extending to enclose the inner wall dielectric layer; and an outer wall dielectric layer extending to enclose the semiconductor pattern while facing the inner wall dielectric layer.

6. The semiconductor memory device according to claim 5, wherein the first vertical barrier further comprises:

a core insulating layer enclosed by the semiconductor pattern.

7. The semiconductor memory device according to claim 1, wherein the cell stacked body comprises:

a plurality of interlayer insulating layers and a plurality of conductive patterns that are alternately stacked.

8. The semiconductor memory device according to claim 7, wherein each of the plurality of conductive patterns has one of substantially an H-shape and substantially a ladder shape in the connection area.

9. The semiconductor memory device according to claim 1, further comprising:

a source select line separation structure configured to partially penetrate a lower portion of the cell stacked body between the first vertical barrier and the second vertical barrier of the connection area.

10. The semiconductor memory device according to claim 1, further comprising:

at least one first contact plug configured to penetrate the first dummy stacked body; and at least one second contact plug configured to penetrate the second dummy stacked body.

11. A semiconductor memory device, comprising:

a cell stacked body including a first extension and a second extension that extend substantially in parallel in substantially a linear shape in a connection area of a substrate;

a first vertical barrier and a second vertical barrier disposed adjacent to each other between the first extension and the second extension, and configured to have a shape of substantially a rectangular frame;

a first dummy stacked body disposed to contact an inner wall of the first vertical barrier and a second dummy stacked body disposed to contact an inner wall of the second vertical barrier; and a connector disposed in a space between the first vertical barrier and the second vertical barrier and configured to connect the first extension and the second extension to each other.

12. The semiconductor memory device according to claim 11, wherein each of the first extension and the second extension comprises a plurality of interlayer insulating layers and a plurality of conductive patterns that are alternately stacked.

13. The semiconductor memory device according to claim 12, wherein the connector electrically connects the plurality of conductive patterns of the first extension to the plurality of conductive patterns of the second extension.

14. The semiconductor memory device according to claim 11, further comprising:

a source select line separation structure disposed under the connector between the first vertical barrier and the second vertical barrier.

15. The semiconductor memory device according to claim 11, wherein the first vertical barrier comprises:

an inner wall dielectric layer extending to enclose a sidewall of the first dummy stacked body;

a semiconductor pattern extending to enclose the inner wall dielectric layer; and an outer wall dielectric layer extending to enclose the semiconductor pattern while facing the inner wall dielectric layer.

16. The semiconductor memory device according to claim 15, wherein the first vertical barrier further comprises:

a core insulating layer enclosed by the semiconductor pattern.

* * * * *